(12) United States Patent
Vénec

(10) Patent No.: US 12,202,575 B2
(45) Date of Patent: Jan. 21, 2025

(54) STANDING RIGGING COMPONENT, IN PARTICULAR THE MAST OF A VESSEL, AND THE METHOD OF ITS MANUFACTURE

(71) Applicant: Sunreef Venture S.A., Gdańsk (PL)

(72) Inventor: Loïc Vénec, Bordeaux (FR)

(73) Assignee: SUNREEF VENTURE S.A. (PL)

(*) Notice: Subject to any disclaimer, the term of this patent is extended or adjusted under 35 U.S.C. 154(b) by 456 days.

(21) Appl. No.: 17/641,462

(22) PCT Filed: Sep. 11, 2019

(86) PCT No.: PCT/PL2019/000078
§ 371 (c)(1),
(2) Date: Mar. 9, 2022

(87) PCT Pub. No.: WO2021/049958
PCT Pub. Date: Mar. 18, 2021

(65) Prior Publication Data
US 2022/0324537 A1  Oct. 13, 2022

(51) Int. Cl.
*B63B 15/00* (2006.01)
*B29C 70/34* (2006.01)
(Continued)

(52) U.S. Cl.
CPC ........ *B63B 15/0083* (2013.01); *B29C 70/342* (2013.01); *B29C 70/68* (2013.01);
(Continued)

(58) Field of Classification Search
CPC ......... B63B 15/0083; B63B 2015/0016; H02S 40/36; H02S 20/00; B29C 70/68; B29C 70/342; B29K 2063/00; B29L 2031/3067
See application file for complete search history.

(56) References Cited

U.S. PATENT DOCUMENTS 5,617,807 A    4/1997  Hulse et al. .................... 114/90

FOREIGN PATENT DOCUMENTS

| CA | 2 435 617 A1 | 3/2004 |
| EP | 2 068 375 A1 | 6/2009 |

(Continued)

OTHER PUBLICATIONS

International Search Report mailed Jun. 9, 2020 in corresponding PCT International Application No. PCT/PL2019/000078.
(Continued)

*Primary Examiner* — Stephen P Avila
(74) *Attorney, Agent, or Firm* — OSTROLENK FABER LLP

(57) ABSTRACT

A standing rigging element, in particular a mast of a vessel, that has a closed profile, and a method of manufacturing the standing rigging element. The halves of the closed profile are made of layers of structural textile saturated with an epoxy resin and have a shape corresponding to the shape of the standing rigging element, after gluing. The mast includes a layer of photovoltaic modules as one of the laminate layers, with a flat set of flexible photovoltaic cells on the outer surface. Cables collecting electricity from photovoltaic modules are routed from each photovoltaic module to common collecting cables, connected to the electric power supply installation of the vessel. The photovoltaic module includes layers of structural textile, wherein one of the layers is a layer of flexible photovoltaic cells.

9 Claims, 5 Drawing Sheets

(51) Int. Cl.
  *B29C 70/68* (2006.01)
  *B29K 63/00* (2006.01)
  *B29L 31/30* (2006.01)
  *H02S 20/00* (2014.01)
  *H02S 40/36* (2014.01)

(52) U.S. Cl.
  CPC .............. *H02S 20/00* (2013.01); *H02S 40/36* (2014.12); *B29K 2063/00* (2013.01); *B29L 2031/3067* (2013.01); *B63B 2015/0016* (2013.01)

(56) References Cited

FOREIGN PATENT DOCUMENTS

| | | | |
|---|---|---|---|
| WO | WO-9015712 A1 | * | 12/1990 |
| WO | WO 2012/076945 A1 | | 6/2012 |
| WO | WO 2014/131782 A1 | | 9/2014 |
| WO | WO 2017/000930 A1 | | 1/2017 |
| WO | WO 2017/061968 A1 | | 4/2017 |
| WO | WO 2017/195995 A1 | | 11/2017 |
| WO | 108964579 A | | 12/2018 |

OTHER PUBLICATIONS

Written Opinion mailed Jun. 9, 2020 in corresponding PCT International Application No. PCT/PL2019/000078.

* cited by examiner

STANDING RIGGING COMPONENT, IN PARTICULAR THE MAST OF A VESSEL, AND THE METHOD OF ITS MANUFACTURE

CROSS-REFERENCE TO RELATED APPLICATIONS

The present application is a 35 U.S.C. §§ 371 national phase conversion of International Application No. PCT/PL2019/000078, filed Sep. 11, 2019, the content of which is incorporated herein by reference. The PCT International Application was published in the English language.

TECHNICAL FIELD

The subject of the invention is a standing rigging component, in particular the mast of a vessel, and the method of its manufacture.

The term of a standing rigging component of a vessel according to this patent disclosure should be understood as elements located above the vessel deck, such as the mast, the mast top, the boom, the yard, the crosstrees, or other elements related with the masts of the vessel.

BACKGROUND OF THE INVENTION

A range of design solutions of standing rigging are known, such as masts of a vessel or of a single-hull or of a multiple-hull yacht, or other elements of standing rigging, for example related to and tied to the mast, such as boom, yard or crosstrees.

Such a rigging element, usually in the case of larger vessels or yachts, is usually produced in a process similar to lamination, where individual layers of structural textiles are placed in a special mould or on a bock and saturated with curable resin. The formed laminate is a composite, a material comprising a combination of two materials with different mechanical, physical and technological properties, in which the structural ingredient, mainly a textile and often named reinforcement, is applied as a series of layers. Various binders, for example an epoxy resin, are present between said layers and within the layers. The reinforcements may be provided in various variants of the laminate as textiles made of unidirectional, continuous fibres or mats made of cut fibres.

Because of its structure, the laminate shows good resistance in the direction of the fibres, but very poor resistance in a direction transverse to the fibres. Such known solutions use mainly a design textile in the form of fibres, applied in layers before saturation with epoxy resin and alternately, in the longitudinal direction of the formed standing rigging element, transverse to the length of such an element and diagonally to the length of such an element. Other embodiments use thicker layers of the design fabric, including alternating fibres, longitudinal, transverse and diagonal to the length of the element.

There are also known applications of photovoltaic systems used on seafaring vessels or on vessels provided with flexible photovoltaic cells. The solution disclosed in the international application WO 2017/195995 presents a marine photovoltaic system generating energy. This system uses many mooring type, fixed pillars attached to an underground foundation and provided, respectively, with lifting mechanisms moving up and down. The main connecting ropes, intended to connect the lifting mechanisms of two adjacent, mooring type fixed pillars, are placed between the mooring type fixed pillars. This flexible, marine photovoltaic system includes auxiliary ropes used to connect the main connecting ropes, passing in the longitudinal and transverse directions. A floating, supporting structure is placed in at least one unit area, among combined, tetragonal areas formed by the main connecting ropes and auxiliary connecting ropes or formed by auxiliary connecting ropes. The photovoltaic cell module is installed on the floating structure. Mechanisms used to connect the vessel with the structure are guided through the main ropes and the auxiliary connecting ropes forming areas of the system, thus attaching the floating structure. According to this known solution, when high waves are formed, the photovoltaic cell modules move in a flexible manner along with the waves. This invention not only allows large scale installation of solar cell modules, but also significantly simplifies the underwater structure of the device.

Another solution is known from the publication WO 2014/131782. It provides a description of a photovoltaic installation for marine applications, including a flexible, polymer-based body containing the first compartment equipped with one or more polymer-based photovoltaic modules. The flexible body may be provided as an inflatable and floating structure. The flexible body may also contain a second compartment, including a ballast space. The ballast space guarantees correct positioning of the flexible body, and thus of one or more polymer-based photovoltaic modules towards the incoming sunlight.

Another known solution disclosed in the international application WO2017061968 describes a foldable and floating photovoltaic energy storage medium, which uses its available surfaces for photovoltaic installations providing the required energy in order to meet the variable energy demand of the vessel. The nature of this functionality lies in the fact that it does not require specialised storage media, flexible installations or foldable elements. This ensures free maneuverability and mooring of the vessel in ports.

The solution disclosed in WO2012076945 presents a sailing vessel including a hull, at least one mast connected with the hull and supporting at least on sail and one or more on-board electric units, wherein the sail contains at least one bearing element in the textile and one or more first flexible photovoltaic panels. They are integrally connected to the first bearing element. The functional connection is executed using at least one electric unit.

Another solution disclosed in CN108964579 presents a hybrid solution intended for use in fishing. The structure of electromechanical connections uses DOF structures with the functional parameter in the form of multiple degrees of freedom. According to this known solution, the hybrid system refers to a known combination of fish farms and generation of photovoltaic energy. The photovoltaic panel module is installed above the surface of a fish pond, water under the photovoltaic panels may be used to farm fish or prawns, and the photovoltaic panel is installed in order to generate energy required for correct operation of the equipment of the farm. Traditional photovoltaic panels with similar applications, however, often have fixed functional parameters, e.g. incident radiation angles are inherently limited and require manual adjustments. This means that solar energy cannot be collected with maximum efficiency and energy generation yield is not ideal. This known solution is related to a floating, hybrid system of fishing and multi-DOF type solar energy unit, in which multiple flexible solar panels are connected using floating latch buttons or magnetic elements. This is intended to form a floating, flexible photovoltaic unit with multiple degrees of freedom DOF. The unit may freely change its shape and angle, following the motion of the water surface and achieves the maximum possible collection of solar energy, with efficient improvement of energy generation yield.

There are known methods of production of standing rigging elements of a vessel. A standing rigging element, especially a vessel mast, is provided in the known solutions as a closed profile made of a laminate composite. In such known solution, manufacture of such an element is characterised in that two halves of such an element are obtained in a mould or in moulds in the lamination process, subsequently folded into the standing rigging element and connecting by gluing and lamination of the joint. The standing rigging element is thus formed as a closed profile. Halves of the profile are manufactured in a forming mould or in moulds, from arranged layers of structural textile saturated with an epoxy resin. Such an element is divided into two halves, generally perpendicular to the main axis of symmetry of the element. After curing and folding, both halves form the shape of the standing rigging element, in particular of a mast, as a hollow closed profile. The same technology is used to manufacture other standing rigging elements made of laminate, cooperating or not cooperating with the sail, such as the top sail, the boom, the yard or the crosstrees, which may also be manufactured according to the invention.

Known solutions use structural textiles in the form of textiles made of carbon, glass, ceramic, aramid or basalt fibres, with the range of basis weight from 50 g/m² to 1000 g/m². These may be single layer textiles with lower basis weight, arranged in multiple layers, or a thicker textile with crossed fibres, arranged as a single layer.

SUMMARY OF THE INVENTION

The objective of the invention is to develop a new solution for a standing rigging element, in particular for a mast, a top mast, a boom, a yard or a crosstrees of a vessel, with an additional task of providing the vessel with an electricity source. For this purpose, a layer of adjacent photovoltaic cell modules has been suggested as one of the external layers of such a rigging element used during the manufacture stage of the rigging element. The number of such modules depends on the architecture of the manufactured standing rigging element.

The problem solved by the invention includes attachment of such modules to the surface of the standing rigging element. In order to solve this problem, said modules were formed as plate-type laminates during manufacture and such plate-type, laminate modules were embedded in the structure of laminate walls of a standing rigging element, for example a vessel mast, during the wall lamination process. It was found during work on this solution that collecting, electric outlet cables discharging energy from such disclosed photovoltaic cell modules may be routed inside the disclosed standing rigging element, for example inside the vessel sail. This provides excellent protection of the cables against mechanical factors related to handling and operation of devices connected to the sail, and against weather conditions, significantly harmful on seas because of their corrosive properties. Notwithstanding the above, elements of the vessel most frequently exposed to sunlight were used in order to provide power supply, namely the example, listed standing rigging elements.

The proposed solution of a manufacture method of the standing rigging element, in particular of a vessel mast, including of embedding photovoltaic cell modules in the structure of such an element, intends to limit interventions related to fixing such modules in the surface structure of the specific standing rigging element, for example in the surfaces structure of a vessel mast. The invention is conceived as a solution of this problem. The solution according to the invention uses known, flat, flexible photovoltaic cells, connected into units used to form laminated layered modules adapted to the shape of the standing rigging element wall, forming one of the outer layers of the wall of the standing rigging element. These modules, formed as rigid laminates, also improve the resistance of the standing rigging element.

According to the invention, the standing rigging element, in particular a vessel sail, is provided as a closed profile, with the wall of such a standing rigging element is made of two halves comprising the form of said closed profile, in particular of a vessel sail. The halves of this closed profile are made of layers of structural textile saturated with an epoxy resin and have a shape corresponding to the shape of the future, hollow standing rigging element, in particular of the mast, after gluing both halves together.

The standing rigging element is characterised in that it includes at least one laminated, layered photovoltaic module containing a flat system of flexible photovoltaic cells as one of its layers. Photovoltaic cells are interconnected and connected to the electric power system of the vessel using collecting cables. The aforementioned, layered photovoltaic module has its shape adapted to the shape of the outer surface of a closed profile comprising the standing rigging element, in particular a vessel mast. Cables collecting electricity from photovoltaic panels are routed from each photovoltaic module to common collecting cables, connected to the electric power supply installation of the vessel.

According to the invention, the layered photovoltaic module includes layers of structural textile, wherein the first layer is the surface layer, the next layer includes at least one layer of non-conductive structural textile, the next layer is a layer of electrically connected photovoltaic cells with outlet collecting cables, the next layer includes at least one layer of non-conductive structural textile, while the last layer of the layered photovoltaic module is a surface layer.

According to the solution according to the invention, outlet cables collecting electricity from the photovoltaic panels are preferably routed inside the closed profile comprising the standing rigging element.

In another preferred solution, the outlet cables collecting electricity from photovoltaic panels may be routed inside a longitudinal groove running along the outer surface of the standing rigging element.

According to the invention, a method of standing rigging element manufacture, in particular of a vessel sail, is characterised in that two halves of a mast are formed, comprising the standing rigging element as a closed profile. The halves of the profile are manufactured in a forming mould, from layers of structural textile saturated with an epoxy resin during the lamination process. After curing, layers of the structural textile adapt a shape, which after joining both halves into a single element, corresponds to the shape of the standing rigging profile, in particular to the shape of a closed profile.

According to the invention, the standing rigging element manufacture method is characterised in that a layer of outer surface textile is placed inside the mould used to form a half of the standing rigging element, and a series of layered photovoltaic modules shaped according to the shape of the mould is then placed onto the surface textile layer. Next, at least one layer of structural textile is applied on the aforementioned photovoltaic modules, followed by curing of the aforementioned composite of structural textile layers containing photovoltaic modules, with an epoxy resin.

In a preferable embodiment of the invention, the curing process of the composite including the structural textile and the epoxy resin is characterised in that the entire mould, with the aforementioned textile layers and photovoltaic modules is locked inside a vacuum packaging, in which vacuum is generated. Next, epoxy resin is introduced into the vacuum packaging and once the epoxy resin is distributed inside the vacuum packaging, the entire system is heated until the composite is cured. Next, one half of the standing rigging element is removed, joined with the other formed half by gluing and the joint area of both halves of the standing rigging elements is preferably laminated.

Heating of a half of the standing rigging element in the vacuum packaging is preferably performed in temperature up to 150° C., and preferably for a period of time between 8 hours and 16 hours.

The layered photovoltaic module is, however, manufactured in a separate mould used to form this photovoltaic module. The outer layer of the manufactured photovoltaic module, made of non-conducting textile, is placed on the mould surface. Next, the first surface layer is used as a substrate for the second layer made of structural textile and this second layer of structural textile is used as a substrate for a layer formed according to the shape of the rigging element, containing a set of electrically connected, flexible photovoltaic panels and this layer of photovoltaic panels is then used as a substrate for at least one more layer of the structural textile and a layer inner surface textile. Elements of electrical connections are then routed through these textile layers and the composite including layers of structural textile is then cured with an epoxy resin.

In an embodiment of the invention, the curing process of the composite including individual layers of the structural textile with the epoxy resin is characterised in that the entire mould of the photovoltaic module with the aforementioned textile layers is locked inside a vacuum packaging, in which vacuum is generated in order to remove air. Next, epoxy resin is introduced into the vacuum packaging and once the resin is distributed spontaneously, the entire system is heated to cure the composite, and the cured photovoltaic module as a laminate is then removed from the vacuum packaging.

Heating of the photovoltaic module in the vacuum packaging is preferably performed in temperature up to 150° C., preferably for a period of time between 8 hours and 16 hours.

According to the invention, a new solution for a standing rigging element was developed, in particular for a mast, a top mast, a boom, a yard or a crosstrees of a vessel, with a additional task of providing the vessel with an electricity source. For this purpose, a layer of adjacent photovoltaic cell modules has been suggested as one of the external layers of this rigging element used during the manufacture stage of the rigging element. The number of such modules depends on the architecture of the manufactured standing rigging element.

According to the invention, the problem of attachment of such modules to the surface of the standing rigging element has been solved. In order to solve this problem, said modules were formed as plate-type laminates during manufacture and such plate-type, laminate modules were embedded in the structure of laminate walls of a standing rigging element, for example in a wall of a vessel mast, during the wall lamination process. It was found during work on this solution that collecting, electric outlet cables discharging energy from such disclosed photovoltaic cell modules may be routed inside the disclosed standing rigging element, for example inside the vessel mast, which is provided as a closed profile. This enabled excellent protection of the cables and connections against mechanical factors related to handling and operation of external moving devices connected to the sail, and against weather conditions, significantly harmful on seas because of their chemical properties. Additionally, the elements of the vessel usually exposed to sunlight, namely the mast, the boom, the top mast or the crosstrees were used as power supply sources.

The proposed solution of a manufacture method of the standing rigging element, in particular of a vessel mast, related to embedding of photovoltaic cell modules in the such an element, intends to limit interventions related to embedding such modules in the surface structure of the specific standing rigging element, for example of a vessel mast. According to the invention, this problem was solved by initially forming laminate modules of photovoltaic cells and installing them as one of the outer layers inside the system of structural textile layers used to make the halves of the aforementioned standing rigging element. The solution according to the invention uses known, flat, flexible photovoltaic cells, connected into units used to form laminated layered elements adapted to the shape of the standing rigging element wall, comprising one of the outer layers of the wall of the standing rigging element.

BRIEF DESCRIPTION OF THE DRAWINGS

The subject of the invention is presented in an embodiment in the attached drawings, in which individual figures of the drawing present the embodiment of a standing rigging element in the form of a vessel mast.

DESCRIPTION OF PREFERRED EMBODIMENTS

Figure 1:
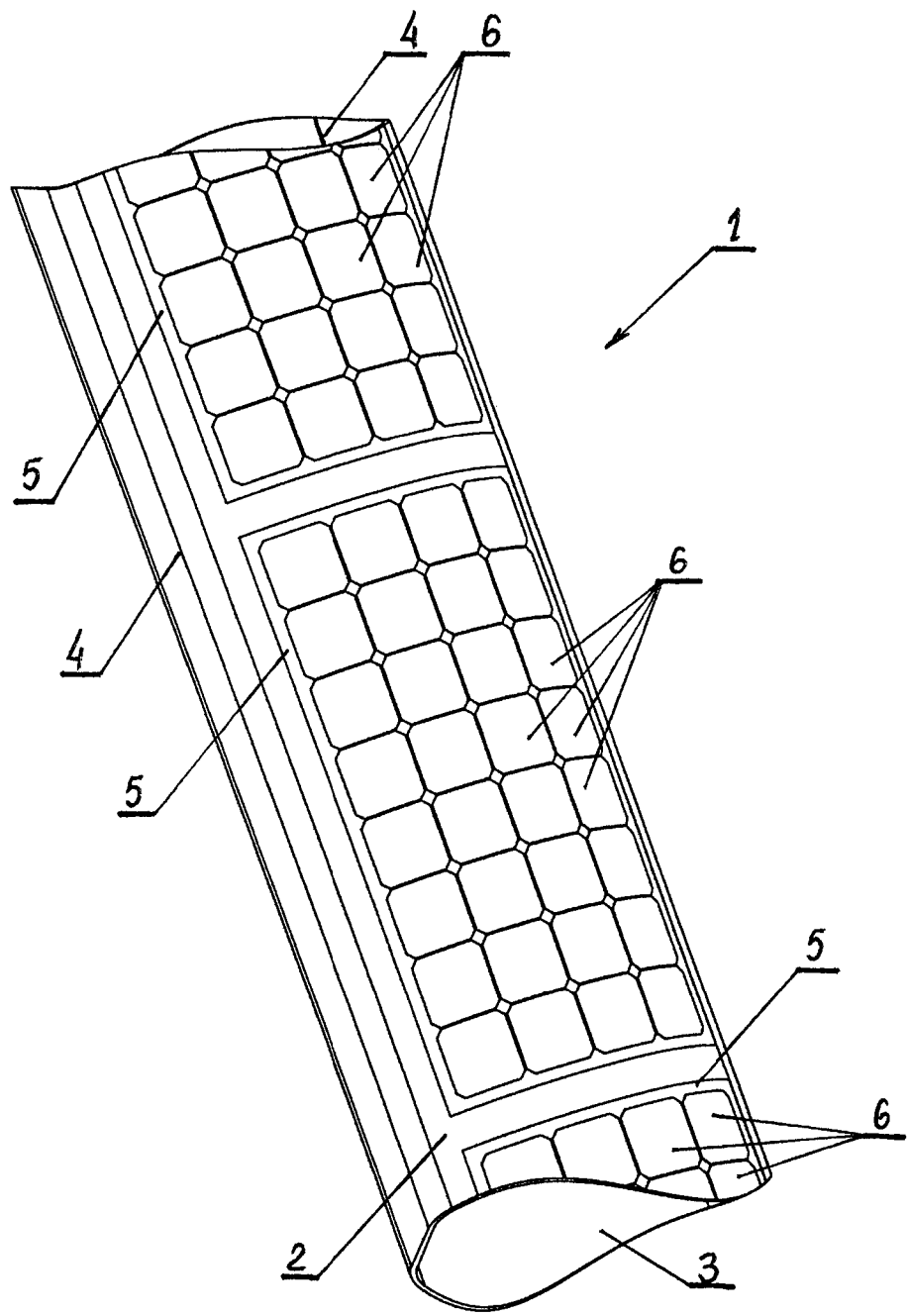
FIG. 1—a part of the mast,
FIG. 2—the layout of layers of the mast wall in the mould used to form a mast half,
FIG. 3—a cross-section of the drawing in FIG. 2,
FIG. 4—the layout of photovoltaic module layers,
FIG. 5—combination of cells in a photovoltaic modules,
FIG. 6—unit transferring connected cells according to FIG. 5,
FIG. 7—a unit according to FIG. 7 during transfer,
FIG. 8—collecting cables of photovoltaic modules,
FIG. 9—electric diagram.
Figure 8:
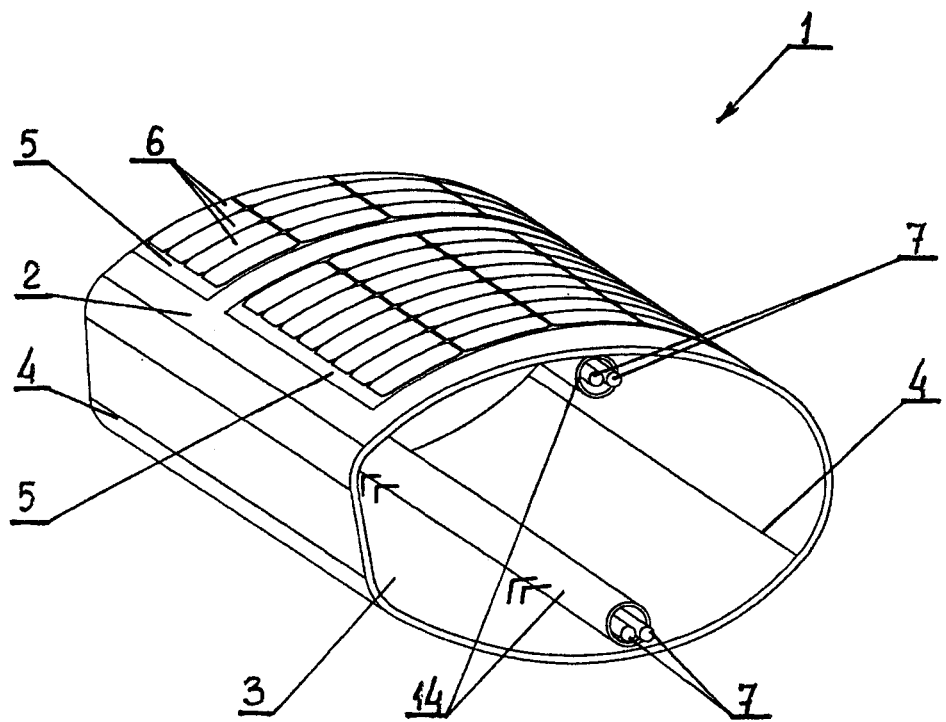

An embodiment of the invention is presented in FIG. 1, in the example of a mast part 1 for a vessel in the form of a multiple hull or a single hull yacht or a vessel provided with a mast. The mast 1 is a closed profile, wherein the wall of the mast 1 is made of two halves 2, 3 comprising the mould of said closed profile. Mast 1 is thus hollow. The halves 2, 3 of this closed profile are made of layers of structural textile saturated with an epoxy resin and have a shape corresponding to the shape of the future, hollow mast 1, after gluing both halves 2, 3 together. The joint edges 4 of halves 2, 3 of the mast 1 are depicted in drawings of FIG. 1 and FIG. 8. The structure of mast 1 is also shown in FIG. 8, which presents an example route of collecting cables 7 inside the mast 1 in more detail.

Mast 1, a fragment of which is shown in FIG. 1, contains laminated, layered photovoltaic modules 5, containing sets of flexible photovoltaic cells 6, as one of the outer layers. This figure depicts modules 5 very clearly wherein inside the ready mast 1 they can be seen under the outer surface layer of the mast 16 depicted in FIG. 2. Modules 5 placed adjacent to one another form one of the layers comprising the wall of the mast 1. Mast 1 has the known form of a hollow pipe element. Photovoltaic cells 6 are interconnected within each of the modules 5 and connected in a known manner to the electric power system of the vessel using collecting cables 7. The layered photovoltaic module 5 has its shape adapted to the known shape of the outer surface of the closed profile comprising the mast 1 of the vessel. Known cables collecting electricity from photovoltaic panels 6 are routed from each photovoltaic module 5 to common collecting cables 7, connected to the electric power supply installation of the vessel in a known system.

Figure 4:
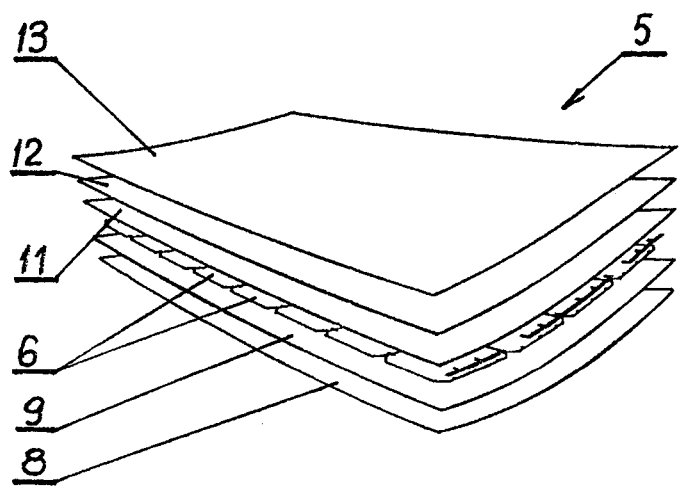

The photovoltaic module 5 is presented in an expanded view in FIG. 4. Module 5 is made of layers of structural textile layers, where the outer layer 8 is the surface layer. The layer 9 of structural non-conductive textile is the second layer in this embodiment. The next layer of the photovoltaic module is the layer 10 of photovoltaic 6 presented in FIG. 5, connected electrically in a known manner and connected to the outlet collecting cables 7 presented in FIG. 8. The next layers in this embodiment include are the two following layers: layer 11 made of non-conducting structural textile and layer 12 made of structural textile, while the last layer of the layered photovoltaic module is the inner surface layer 13. The term of structural textile related to layers of module 5 should be understood in this patent disclosure as textiles made of carbon, glass, ceramic, aramid or basalt fibres with a basis weight between 50 g/m$^2$ and 250 g/m$^2$. These may be single layer textiles with lower basis weight, arranged in multiple layers, or a single thicker textile with crossed fibres, arranged as a single layer.

Figure 5:
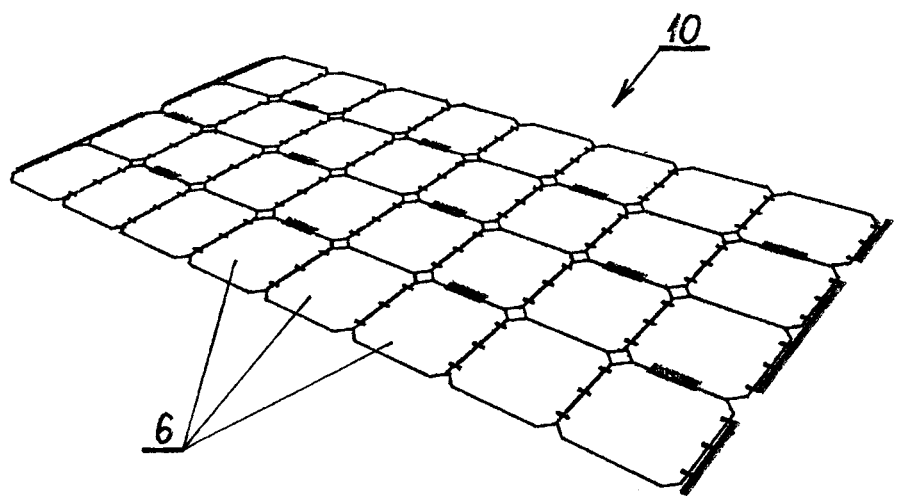

FIG. 5 presents an example system of photovoltaic modules 6 comprising a layer 10 of the layered photovoltaic module 5. As shown in this Figure, cells 6 are electrically connected and provided with known electric outlets on their edges, enabling their connection to collecting cables 7.

The collecting cables 7 collecting electricity from photovoltaic modules 5 are routed inside the mast 1, in protective pipes 14 in this particular embodiment. This is shown in FIG. 8. It cannot be excluded in other embodiments that collecting cables 7 collecting electricity from photovoltaic modules 5 may be routed inside a longitudinal aperture along the outer surface of the mast 1, and the aperture may be closed with a longitudinal wedge.

Figure 9:
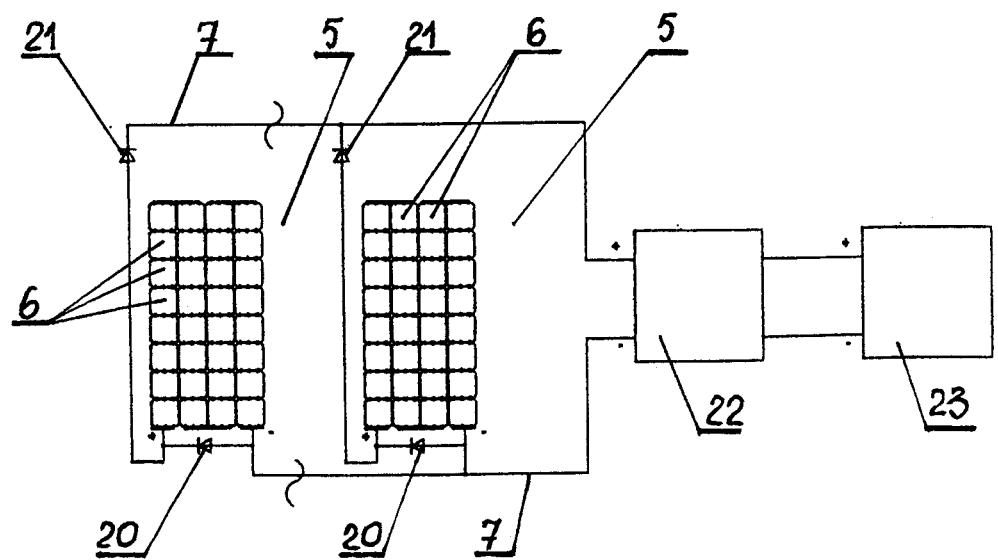

An example of electric connections of photovoltaic modules 5 is shown in FIG. 9. Both poles of photovoltaic modules 6 are connected in series and collecting cables 7, anodes and cathodes, are routed from the photovoltaic module 5. Both poles of each module 5 are short-circuited using a bypass diode 20. Cathodes of these modules 5 are connected in parallel to the collecting cable 7 of the cathode. Anodes of other modules 5 are also connected in parallel to the collecting cable 7 of the anode, via blocking diodes 21. Both collecting cables 7 are routed through a known regulator 22 to a batter 23 comprising an element of the power supply system of the vessel.

The method of manufacture of such a standing rigging element is described below in an example embodiment and in relation to the manufacture method for a mast intended for single hull or multiple hull boat or for a vessel. Mast 1 is a closed, hollow profile manufactured using the lamination technology. This method is characterised in that both halves of the mast are manufactured, with the main edges subsequently used to fold the mast halves passing generally within planes coinciding with the plane of the longitudinal axis of symmetry of the manufactured mast. Both halves, when combined, form the closed profile in the form of a hollow mast 1 body. FIG. 1 and FIG. 8 present the folding edges 4 of both halves of the mast 1, with only parts of the mast shown for clarity.

Figure 2:
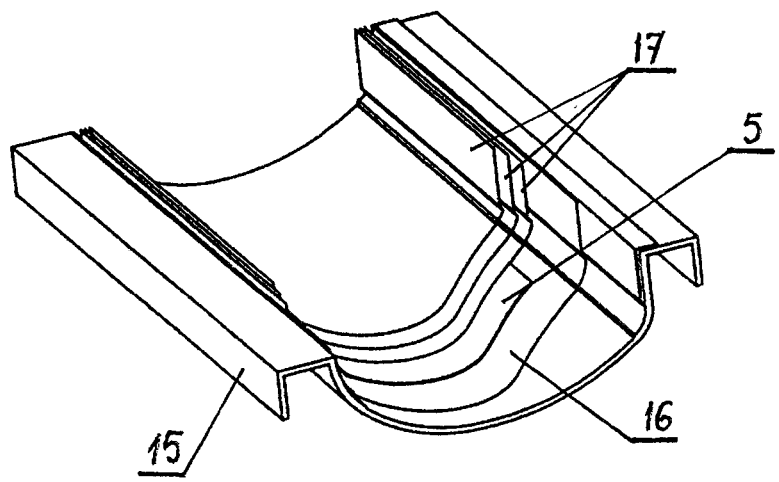
Figure 3:
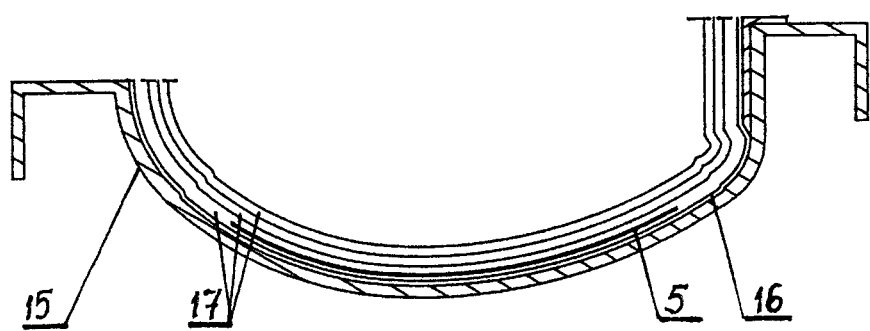

Halves of the mast 1 are manufactured using the mould 15, a fragment of which is shown in FIG. 2. The same part of the mould 15 is presented as a cross-section in FIG. 3. The mould 15 is concave in this embodiment and used to manufacture the aforementioned halves 2, 3 of the mast 1, wherein layers of structural textile are placed inside the mould 15 and saturated with an epoxy resin in order to perform the lamination process afterwards. After curing of the laminate made of layers of structural textile and of the epoxy resin, the product is formed inside this mould 15 into a shape of the disclosed mast half, which combined with the other, similar half into a single structure forms the closed profile comprising the body of mast 1.

The method of manufacture of a standing rigging element in an example embodiment of a vessel mast, characterised in that the mould 15 used to form a mast half and prepared through application of a known anti-adhesion agent on its surface, is used to place the outer surface layer 16 used a substrate for a series of layered photovoltaic modules 5 formed according to the shape of said mould 15, designed for halves 2, 3 of mast 1. Halves 2, 3 of mast 1 differ in design details in different embodiments and in such cases two different moulds should be used in order to obtain the halves 2, 3 of mast 1.

Three layers 17 of a structural textile are then placed on photovoltaic modules 5 placed on the surface layer 16 adjacent to one another, and curing of the aforementioned composite of structural textile layers containing the photovoltaic module layer 5 is then cured with an epoxy resin. According to an embodiment of the invention, the aforementioned structural textiles are used as textiles made of carbon, glass, ceramic, aramid or basalt fibres with basis weight of 50 g/m$^2$ to 1000 g/m$^2$. Individual layers of the structural textile are placed alternately in order to achieve good resistance of the product, for example, the first layer 17 with fibres along the mast, the second layer 17 with fibres transverse to the mast, and the third layer of this textile with fibres diagonal to the mast length. Thus placed layers 17 forming the laminate with the epoxy layer guarantee resistance of the mast 1 to stress applied in various directions.

A range of known lamination methods is known for such products, for example by mechanically applying epoxy resin on individual layers, during separate processes, with resin application on all textile layers inside the mould within a single process or by using a multi-layer textile with resin present within the textile and activated when heated.

In this embodiment of the method of manufacture of mast 1 according to the invention, the curing of the composite made of structural textile with epoxy resin is executed such that once all aforementioned textile layers are placed inside the mould used to manufacture of mast halves, together with a layer of adjacent photovoltaic modules 5, the entire mould with the aforementioned textile layers and with the photovoltaic module layer 5 is closed inside a vacuum packaging and vacuum is generated inside this vacuum packaging. Once the vacuum is generated, epoxy resin is introduced into the vacuum packaging through a known valve and once the epoxy resin is spontaneously distributed, saturating said layers, the entire system is heated in order to cure the multi-layer composite containing the layer of adjacent photovoltaic modules 5 as one of the outer layers. The half of a mast 1 is then removed and joined to the second half of the mast manufactured in the same process, by gluing both halves 2, 3 along their edges 4 and the joint area of both halves of the standing rigging elements is then laminated.

Heating of mast halves in the vacuum packaging is performed in this embodiment in temperature up to 100° C., and preferably for at least 12 hours.

The layered photovoltaic module is, however, manufactured in a separate mould used to form this photovoltaic module. This mould is not presented in the figure, as it is similar to a mould intended for manufacture of mast halves with the only difference between the moulds being their size. Its shape is adapted to the shape of the surface of each half of the mast 1, where modules 5 are to be laminated.

The concave shape of the photovoltaic module lamination mould is used to place individual layers of the layered photovoltaic module 5 therein. These layers are presented in an expanded view in FIG. 4. The surface layer 8 comprising the outer layer of the manufactured photovoltaic module 5 and made of textile transparent to light is placed inside the module lamination mould. Next, this first surface layer 8 is used as a substrate for the second layer 9 made of non-conductive structural textile and this second layer 9 is used as a substrate for a layer formed according to the shape of the mast surface, containing a set of electrically connected, flexible photovoltaic cells 6 and this layer of photovoltaic cells 6 is then used as a substrate for at two layers in this embodiment: layer 11 made of non-conductive textile and layer 12 made of structural textile. The next layer 13 is the surface layer. Known elements of electrical connections are then routed through these textile layers and the composite including the aforementioned layers is then cured with an epoxy resin.

In this embodiment, the process of curing the composite made of individual layers of the structural textile with an epoxy resin in the photovoltaic module 5 is characterised in that the entire mould of the photovoltaic module 5, including the aforementioned layers presented in FIG. 5 is closed in a known vacuum packaging, for example inside a plastic film and vacuum is generated inside the vacuum packaging in order to remove air and achieve contact between said layers. Next, epoxy resin is introduced to the disclosed vacuum packaging through a known cut-off valve and once the resin is spontaneously distributed, the entire system is heated in order to cure the obtained composite, and the cured photovoltaic module in the form of laminate is then removed from the vacuum packaging.

Heating of the photovoltaic module in the vacuum packaging is performed in this embodiment in temperature preferably up to 100° C., and preferably for at least 10 hours. After this time, the photovoltaic module 5 is ready to be embedded into the walls of a half of the mast 1. Both halves of the mast are provided with a photovoltaic module layer 5 during the manufacture stage.

Figure 6:
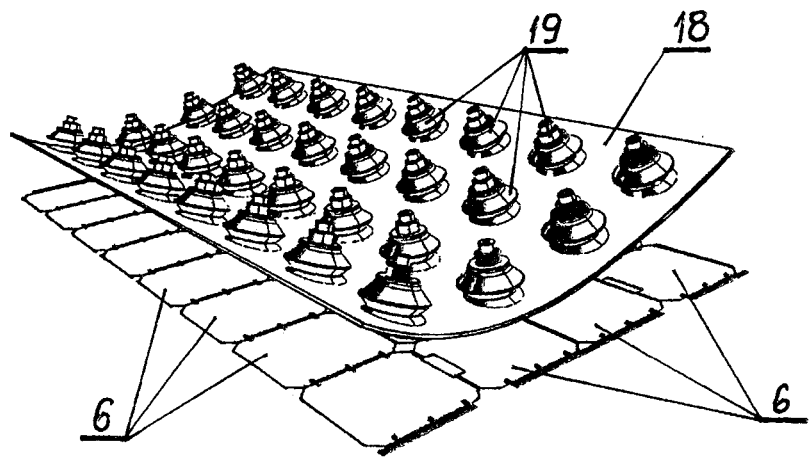
Figure 7:
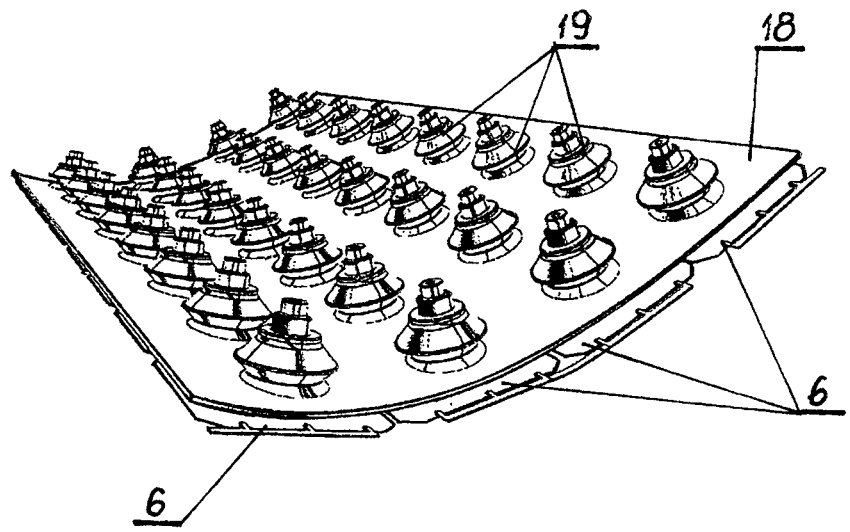

Before the layered photovoltaic module 5 is manufactured, individual photovoltaic cells 6 are placed on a plane, forming the desired layout, as presented in FIG. 5 and FIG. 6. Outlets of individual poles of each cell 6 are then connected in a known manner. The thus formed set of flat, flexible cells 6 is transferred onto layers 8, 9 previously placed on the concave surface of the module 5 lamination mould with a structure similar to mould 15. In this embodiment of the invention, the transfer of the disclosed, connected set of cells 6 takes place by lowering a bent bearing plate 18 provided with a set of suction cups 19 onto the set of cells 6, with openings corresponding to the distance between photovoltaic cells 6 made in the bearing plate 18. This is shown in FIG. 6. Lips of suction cups 19 are located above each of the openings. One side of the bearing plate 18 is lowered onto the terminal photovoltaic cells 6, under vacuum. This plate 18 is then rolled over the set of cells 6 in order to achieve contact between the openings and the suction cups 19 over individual rows of photovoltaic cells 6, until the suction cups reach the last row of photo voltaic cells. All flexible photovoltaic cells 6 are sucked to the suction cups 19 on the bearing plate 18, as shown in FIG. 7. In this position, the bearing plate 18 is used to transfer the set of connected photovoltaic cells 6 whilst retaining the desired geometry, according to the curvature of the aforementioned mould used to form photovoltaic modules, conforming to the curvature of mould 15 used to form halves 2, 3 of the mast 1. Once the connected cells 6 are lowered onto layers 8, 9 shown in FIG. 4 and placed inside the mould used to form photovoltaic modules 5, vacuum is switched off and the bearing plate 18 is lifted off the set of photovoltaic cells 6 in this mould, which is covered with textile layers 11, 12, 13 during the next step. The mould with the aforementioned layers is then placed inside the aforementioned vacuum packaging, vacuum is generated and the aforementioned operations of adding epoxy resin to the vacuum packaging and curing are then performed in order to obtain a layered photovoltaic module ready to be placed inside the layered system during the step of manufacture of the half 2, 3 of the mast 1.

LIST OF DESIGNATIONS USED IN THE FIGURES

1. Mast
2. Mast half
3. Mast half
4. Joint edge
5. Photovoltaic module
6. Photovoltaic cell
7. Collecting cables
8. Outer layer of the module
9. Non-conducting structural textile layer
10. Photovoltaic cell layer
11. Non-conducting structural textile layer
12. Structural textile layer
13. Surface layer
14. Protective pipe
15. Mast shape
16. Outer surface layer
17. Structural textile layer
18. Bearing plate
19. Suction cup
20. Bypass diode
21. Blocking diode
22. Regulator
23. Battery

The invention claimed is:

1. A standing rigging element, in particular mast of a vessel comprising: a wall, wherein the wall of said standing rigging element is made of two halves that together form a body with a closed profile shape, in particular of a vessel mast, with the two halves of the closed profile made of layers of structural textile saturated with epoxy resin, with a shape corresponding to a shape of a future standing rigging element after gluing along edges of longitudinal division, and further comprising at least one layered photovoltaic module with a flat set of flexible photovoltaic cells, interconnected and connected to an electric power supply system of the vessel, wherein the layered photovoltaic module has its shape adapted to a shape of an outer surface of the closed profile comprising the standing rigging element, in particular a vessel mast, wherein cables collecting electricity from the photovoltaic modules are routed from each of the photovoltaic modules to common collecting cables connected with the electric power supply system of the vessel, wherein the photovoltaic module includes layers of structural textile, wherein, in order, a first layer is a surface layer, a second layer includes at least one layer of non-conductive structural textile, a third layer is a layer of electrically connected photovoltaic cells with outlet cables, a fourth layer includes at least one layer of non-conductive structural textile and a layer of structural textile, while a last layer of the photovoltaic module is another surface layer.

2. The rigging element according to claim 1, wherein the collecting cables collecting electricity from photovoltaic modules are routed inside the standing rigging element.

3. The rigging element according to claim 1, wherein the collecting cables collecting electricity from photovoltaic modules are routed inside a longitudinal groove running along the outer surface of the standing rigging element.

4. A method of manufacture of the standing rigging element, in particular of a vessel mast, which comprises a closed profile, in which two halves of the rigging element are folded along an edge of longitudinal division, forming a standing rigging element in a closed profile form, where the two halves are manufactured in a mould used to shape the element from placed layers of structural textile saturated with epoxy resin and curing takes place inside the mould, with the element corresponding to the standing rigging element's shape after folding both halves along the edge of longitudinal division, wherein, in the form used to shape the half of the standing rigging element, an outer surface textile layer is placed, and subsequently used as a substrate for adjacent, layered photovoltaic modules formed according to the shape of said mould, used as a substrate for at least one layer of structural textile, followed by curing of the aforementioned composite of structural textile layers, including a layer of photovoltaic modules, with epoxy resin, wherein said curing of the composite of structural textile with epoxy resin includes closing the entire mould with the aforementioned layers inside a vacuum packaging and vacuum is generated inside said vacuum packaging, after which epoxy resin is introduced into the vacuum packaging and once the resin is distributed, the vacuum packing is heated in order to cure the composite, and the half of the standing rigging element is then removed, joined with the second manufactured half, and the joint edge area of both halves of the standing rigging element is laminated.

5. A method of manufacture of the standing rigging element, in particular of a vessel mast, which comprises a closed profile, in which two halves of the rigging element are folded along an edge of longitudinal division, forming a standing rigging element in a closed profile form, where the two halves are manufactured in a mould used to shape the element from placed layers of structural textile saturated with epoxy resin and curing takes place inside the mould, with the element corresponding to the standing rigging element's shape after folding both halves along the edge of longitudinal division, wherein, in the form used to shape the half of the standing rigging element, an outer surface textile layer is placed, and subsequently used as a substrate for adjacent, layered photovoltaic modules formed according to the shape of said mould, used as a substrate for at least one layer of structural textile, followed by curing of the aforementioned composite of structural textile layers, including a layer of photovoltaic modules, with epoxy resin, and wherein heating in the vacuum packaging takes place in temperature up to 150° C., between 8 hours and 16 hours.

6. The method according to claim 4, wherein the layered photovoltaic module is manufactured in a mould used to form the photovoltaic module, in which the outer surface layer is placed and used as a substrate for placing the second layer made of non-conducting structural textile, used in turn as a substrate for placing a layer formed according to the shape of the rigging element, which includes a layer containing a set of electrically connected, flexible photovoltaic cells and said layer of photovoltaic cells is used as a substrate for the next layer made of non-conductive structural textile and a layer made of structural textile, as well as the inner surface textile layer, after which elements of electrical connections are routed through said layers and the composite of layers of structural textile are cured with an epoxy resin.

7. The method according to claim 6, wherein the layer containing the set of electrically connected, flexible photovoltaic cells are transferred onto the second layer of structural textile by sucking these photovoltaic cells to a bearing plate with a set of openings with suction cups corresponding to the layout of photovoltaic cells, wherein the bearing plate is formed according to the shape of the mould used to form halves of the rigging element while individual rows of photovoltaic cells are sucked to openings in the bearing plate individually, by rolling this bearing plate from one edge of the set of photovoltaic cells towards the other edge of the set of photovoltaic cells, and once said set of photovoltaic cells is transferred to the mould used to laminate the photovoltaic module suction action is removed from suction cups of the bearing plate and the bearing plate is removed.

8. The method according to claim 6, wherein curing of the composite of individual layers of structural textile with epoxy resin is performed such that the entire mould of the photovoltaic module with said layers is closed inside a vacuum packaging and vacuum is generated inside such a vacuum packaging, after which epoxy resin is introduced into the vacuum packaging, and once the resin is distributed, the vacuum packaging is heated to cure the composite and the photovoltaic module is then removed from the vacuum packaging.

9. The method of manufacture according to claim 8, wherein heating in the vacuum packaging takes place in temperature up to 150° C., preferably between 8 hours and 16 hours.

* * * * *